United States Patent
Li et al.

(10) Patent No.: US 7,029,595 B1
(45) Date of Patent: Apr. 18, 2006

(54) SELECTIVE ETCH FOR UNIFORM METAL TRACE EXPOSURE AND MILLING USING FOCUSED ION BEAM SYSTEM

(75) Inventors: Xia (Susan) Li, Fremont, CA (US); Eugene A. Delenia, Morgan Hill, CA (US); Rosalinda M. Ring, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 323 days.

(21) Appl. No.: 10/226,802

(22) Filed: Aug. 21, 2002

(51) Int. Cl.
*H01L 21/00* (2006.01)

(52) U.S. Cl. .......................... 216/66; 216/75; 438/712; 438/725; 250/492.3

(58) Field of Classification Search ................ 216/66, 216/75, 74; 438/712, 725; 250/492.3
See application file for complete search history.

(56) References Cited

U.S. PATENT DOCUMENTS

| | | | |
|---|---|---|---|
| 5,616,921 A * | 4/1997 | Talbot et al. ............... 250/307 |
| 5,840,630 A * | 11/1998 | Cecere et al. ............... 438/712 |
| 6,407,001 B1 * | 6/2002 | Scott .......................... 438/712 |
| 6,730,237 B1 * | 5/2004 | Sievers et al. ............... 216/62 |
| 6,806,198 B1 * | 10/2004 | Ring et al. .................. 438/706 |

* cited by examiner

*Primary Examiner*—Shamim Ahmed
(74) *Attorney, Agent, or Firm*—Winstead Sechrest & Minick P.C.

(57) ABSTRACT

A system and method for exposing and/or milling a copper metallization layer disposed in dielectric that may have an overlying polyimide layer preferably by use of a FIB machine system used for exposing/milling aluminum metallization layers is disclosed. The method includes using a gas assisted (GAS) system for exposing a portion of a copper metal trace disposed in a dielectric and includes the step of removing a portion of the dielectric overlying the portion of the metal trace using the GAS system activated with a dielectric selective chemical that does not have a significant spontaneous (non ion-beam induced) reaction with the metal trace. The system includes a focused ion beam (FIB) machine for exposing/milling a portion of a metal trace disposed in a dielectric substrate wherein the metal trace is copper.

16 Claims, 6 Drawing Sheets

FIGURE_5

SELECTIVE ETCH FOR UNIFORM METAL TRACE EXPOSURE AND MILLING USING FOCUSED ION BEAM SYSTEM

FIELD OF THE INVENTION

The present invention relates generally to selective etch to expose a metal trace disposed in a dielectric using a focused ion beam (FIB) system, and more specifically to exposing a copper trace disposed in a dielectric layer having a protective polymer layer using a FIB system designed for exposing aluminum traces disposed in a dielectric without a protective polymer layer.

BACKGROUND OF THE INVENTION

Copper is being used in place of aluminum as a metallization layer in high performance integrated circuit (IC) devices. It is well-known to use Gas Assisted Systems (GAS) in conjunction with a focused ion beam (FIB) machine for exposing and milling an aluminum metallization layer. GAS is accomplished by the introduction of a reactive gas into the FIB chamber (through a gas injector) to enhance a rate at which the FIB removes a dielectric layer or an aluminum layer and provides higher selectivity (better end-point control).

The reaction products are volatile which limits re-deposition and permits fabrication of high aspect ratio structures. Chemicals used in GAS are well established when exposing an aluminum metallization. These aluminum metallization exposure chemicals include $Cl_2$ or $I_2$ for aluminum (Al) and silicon (Si) removal, $XeF_2$ for titanium (W), $Si_3N_4$, $SiO_2$ removal, and $H_2O$ (water-based chemical) for polyimide, photoresist and other carbon based materials removal.

However, many chemicals used for exposing and milling the aluminum metallization layer cannot be used for exposing and milling a metallization layer that is copper (Cu). For example, halogen-based chemicals, such as $Cl_2$ and $I_2$, are used to enhance aluminum layer metallization milling by at least a factor of ten (10) (compared with the default FIB etch without any chemicals). Unfortunately, these halogen-based chemicals have a spontaneous reaction with copper and results in a loss of etch anisotropy, creating a corrosive-like by-products on the surface of the exposed copper metallization layer.

Research has been done on trying to find suitable chemicals for copper milling by FIB vendors, universities and semiconductor companies. Many supplemental chemicals have been suggested and examined trying to find a suitable chemical for copper milling. These supplemental chemicals have included a mixture of $Cl_2$ and anhydrous ammonia ($NH_3$) by K. Edinger, *Gas Assisted Etching of Copper with Focused Ion Beams*, K. Edinger, Institute for Plasma Research, University of Maryland, College Part, Md., 20742, or $C_2Cl_4$ by Phillips, *Developments for Chemically Enhanced Focused Ion Beam Micromachining of Copper*, J. R. Phillips, T. S. Stark, D. P. Griffis, P. E. Russel; Materials Science and Engineering Dept., Analytical Instrumentation Facility, NCSU, Raleigh, N.C., USA. However, no ideal solution was found so far without compromise on the performance and ease of use. Some of the solutions have safety issues for actual use in an industrial environment.

Additionally, IC manufacturing companies have significant investments in existing FIB machine systems designed for exposing and milling aluminum metallization layers and it would be desirable to use these systems for exposing and milling copper metallization layers with minimal changes.

There are two major issues that are addressed for copper metallization layers. These include: 1) exposing copper traces uniformly for cutting or deposition, and 2) milling exposed copper traces using chemicals that uniformly and effectively remove top copper traces without degrading other nearby structures.

Conventional FIB machine systems operate simply when exposing/milling aluminum metallization layers. The conventional FIB system uses a dielectric-enhanced milling chemical, such as commercially available $XeF_2$, to remove the dielectric material overlying a portion of the aluminum trace to be exposed/milled (such as, $Si_3N_4$ and/or $SiO_2$). Typically, copper metallization layers are used in high performance ICs that often use C4 (controlled collapse chip connection) flip-chip technology. C4 ICs often have an additional polyimide layer on top of the dielectric material for further protection that is not effectively removed with XeF2.

A polyimide layer may be removed with Selective Carbon Mill (SCM) chemical that has an enhanced rate of 20× relative to the removal of the typical underlying dielectric material. SCM is a special water-based chemical developed for removing carbon-based materials effectively and is available commercially from various vendors, particularly FIB Machine vendors. For example, FEI Company, 7451 NW Evergreen Parkway, Hillsboro, Oreg. USA 97124-5830, phone: 503-640-7500 (http://www.feic.com) is one source for SCM. The SCM chemical does not have any appreciable enhancement for removal/milling for the dielectric layers and metallization layers.

Conventionally, FIB machines use XeF2 for removing both polyimide and dielectric layers, with an enhance rate of 4–15× and 5–10× respectively. However, the milling uniformity of XeF2 strongly depends upon a direction of gas flux induced to a surface of the sample.

FIG. 1 is a schematic illustration of a typical consequence of use of $XeF_2$ in a GAS system 100 having an ion beam column 105 directing a focused ion beam (FIB) 110 in the presence of $XeF_2$ delivered by a gas injector 115. FIB 110 removes a polyimide layer 120 and a dielectric layer 125 overlying a desired node 130. Using only $XeF_2$ produces a trench 135 having one side 140 over-exposed while another side 145 is under-exposed. This asymmetric trench 135 causes potential problems for subsequent work in the area on desired node 130.

FIG. 2 is a schematic illustration of a typical consequence of use of SCM in a GAS system 200 having an ion beam column 105 directing a focused ion beam (FIB) 110 in the presence of SCM delivered by a gas injector 115. FIB 110 removes a polyimide layer 120 and a dielectric layer 125 overlying a desired node 130. Using only SCM produces very long etch times due to slow etch rate of SCM chemical on dielectric layer 125 while producing a trench 135. Additionally, the SCM chemical has a grain preferential etch for copper (Cu) (with some grains etching much faster than others), that damages an exposed copper node 205.

FIG. 3 is a schematic illustration of a typical consequence of use of $XeF_2$ in a GAS system 300 having an ion beam column 105 directing a focused ion beam (FIB) 110 in the presence of $XeF_2$ delivered by a gas injector 115 during a copper milling step. After a polyimide layer 120 and a dielectric layer 125 overlying a desired node 130 has been removed, node 130 is milled using $XeF_2$ in GAS 300. Using only $XeF_2$ for milling produces very long etch times due to slow etch rate of $XeF_2$ chemical on the copper of node 130 while producing a trench 205. One node 130 is completely milled (node 130 is shown in phantom as node 310 after milling), trench 305 is over-etched to expose a non-desired node 315.

Accordingly, what is needed is a system and method for exposing and/or milling a copper metallization layer disposed in a dielectric material that may have an overlying polyimide layer. The system and method should be easily implemented, cost effective and compatible with existing FIB machine systems used for exposing/milling aluminum metallization layers. The present invention addresses such a need.

SUMMARY OF THE INVENTION

A system and method for exposing and/or milling a copper metallization layer disposed in dielectric that may have an overlying polyimide layer preferably by use of a FIB machine system used for exposing/milling aluminum metallization layers is disclosed. The method includes using a gas assisted (GAS) system for exposing a portion of a copper metal trace disposed in a dielectric and includes the step of removing a portion of the dielectric overlying the portion of the metal trace using the GAS system activated with a dielectric selective chemical that does not have a significant spontaneous (non ion-beam induced) reaction with the metal trace. The system includes a focused ion beam (FIB) machine for exposing/milling a portion of a metal trace disposed in a dielectric substrate wherein the metal trace is copper.

The present invention simply and efficiently enables exposure and/or milling of a metallization layer of copper disposed in a dielectric that may have an overlying polymer (e.g., polyimide) protective layer and could be used with GAS systems and/or FIB machines previously used with aluminum metallization layers.

DETAILED DESCRIPTION

The present invention relates to exposing a copper trace disposed in a dielectric layer having a protective polymer layer using a gas-assisted system (GAS) designed for exposing aluminum traces disposed in a dielectric without a protective polymer layer. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Figure 1:
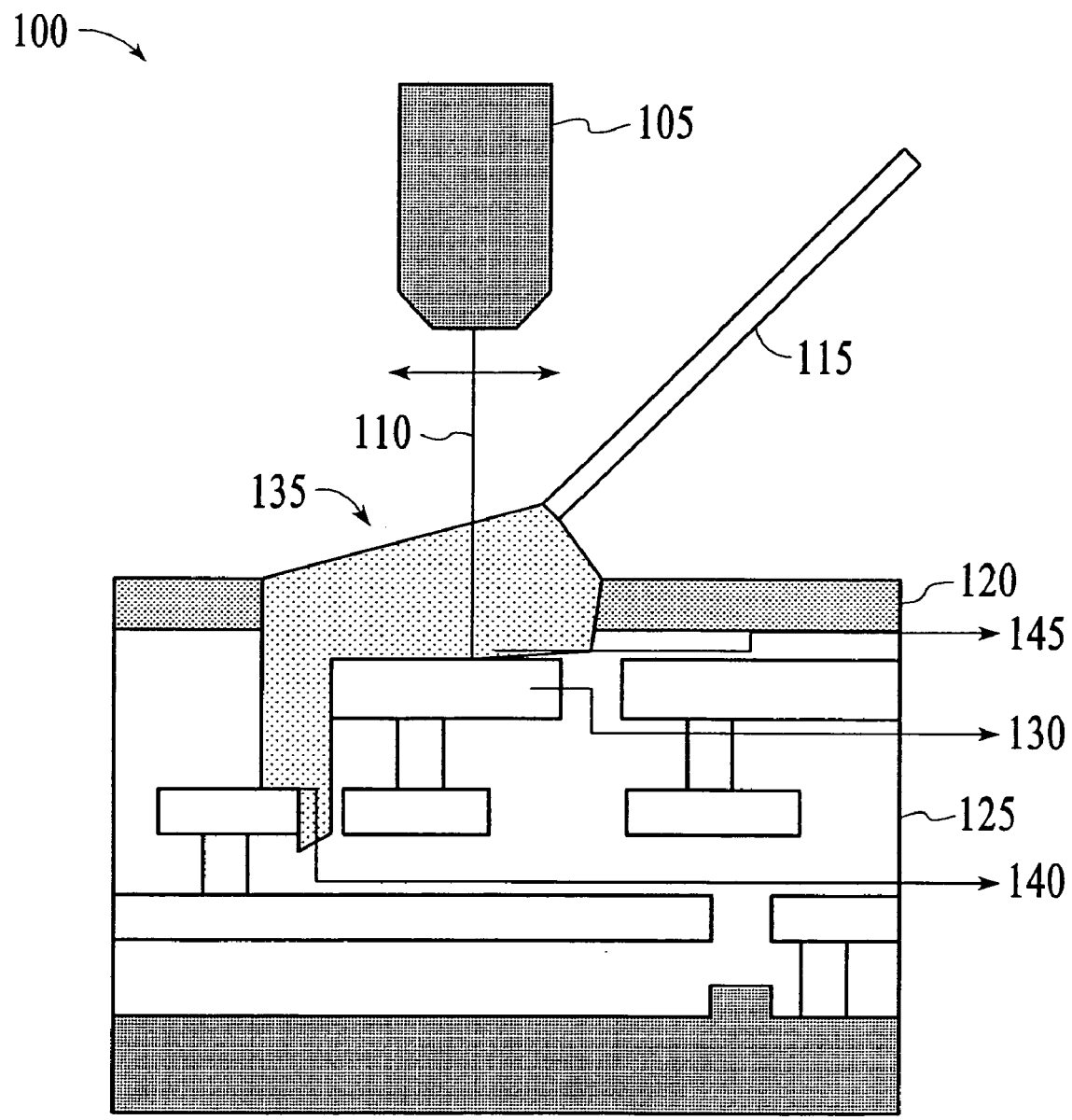
FIG. 1 is a schematic illustration of a typical consequence of use of $XeF_2$ to remove the polyimide layer and the dielectric layer.
Figure 2:
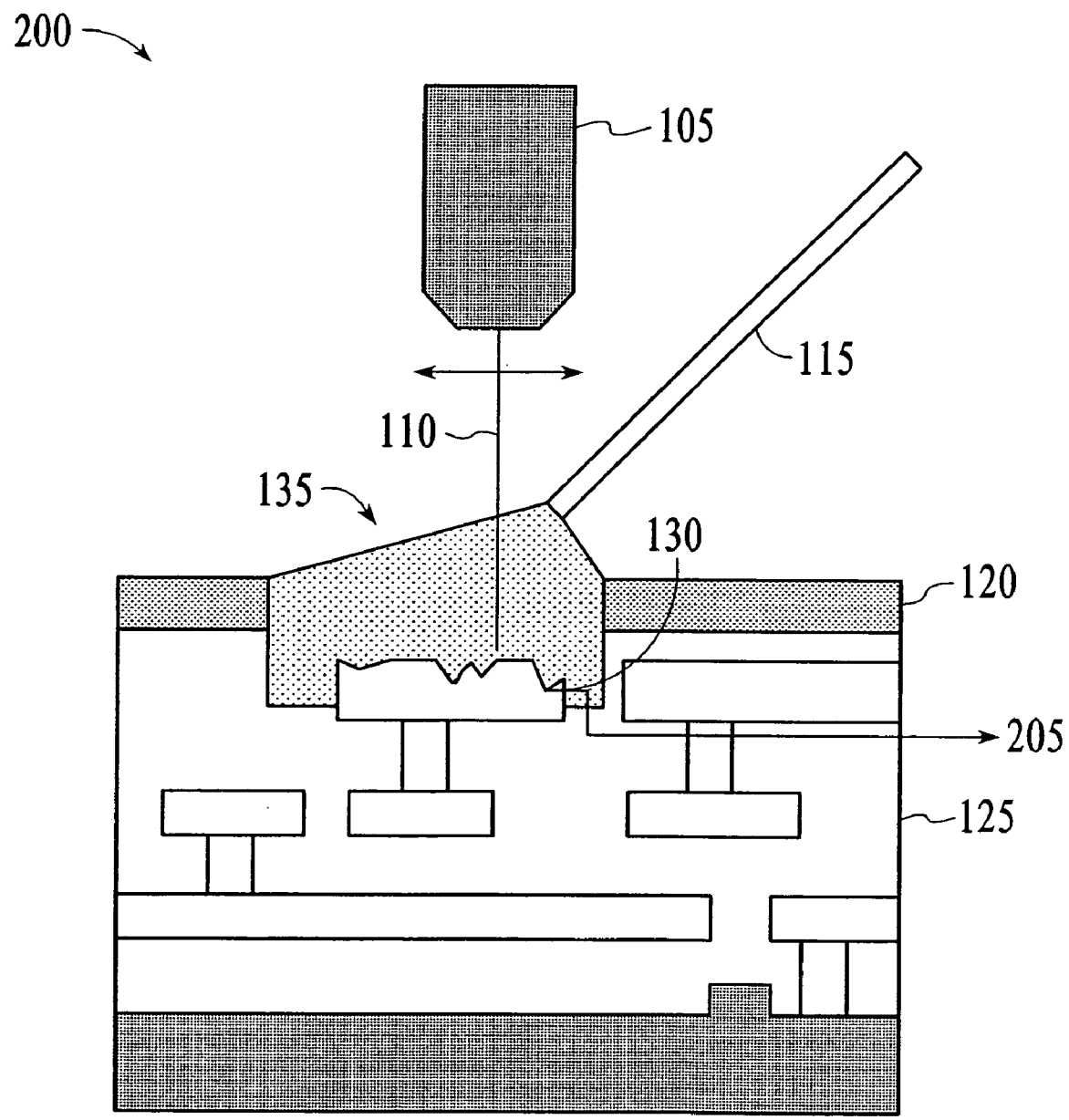
FIG. 2 is a schematic illustration of a typical consequence of use of SCM to remove the polyimide layer and the dielectric layer.
Figure 3:
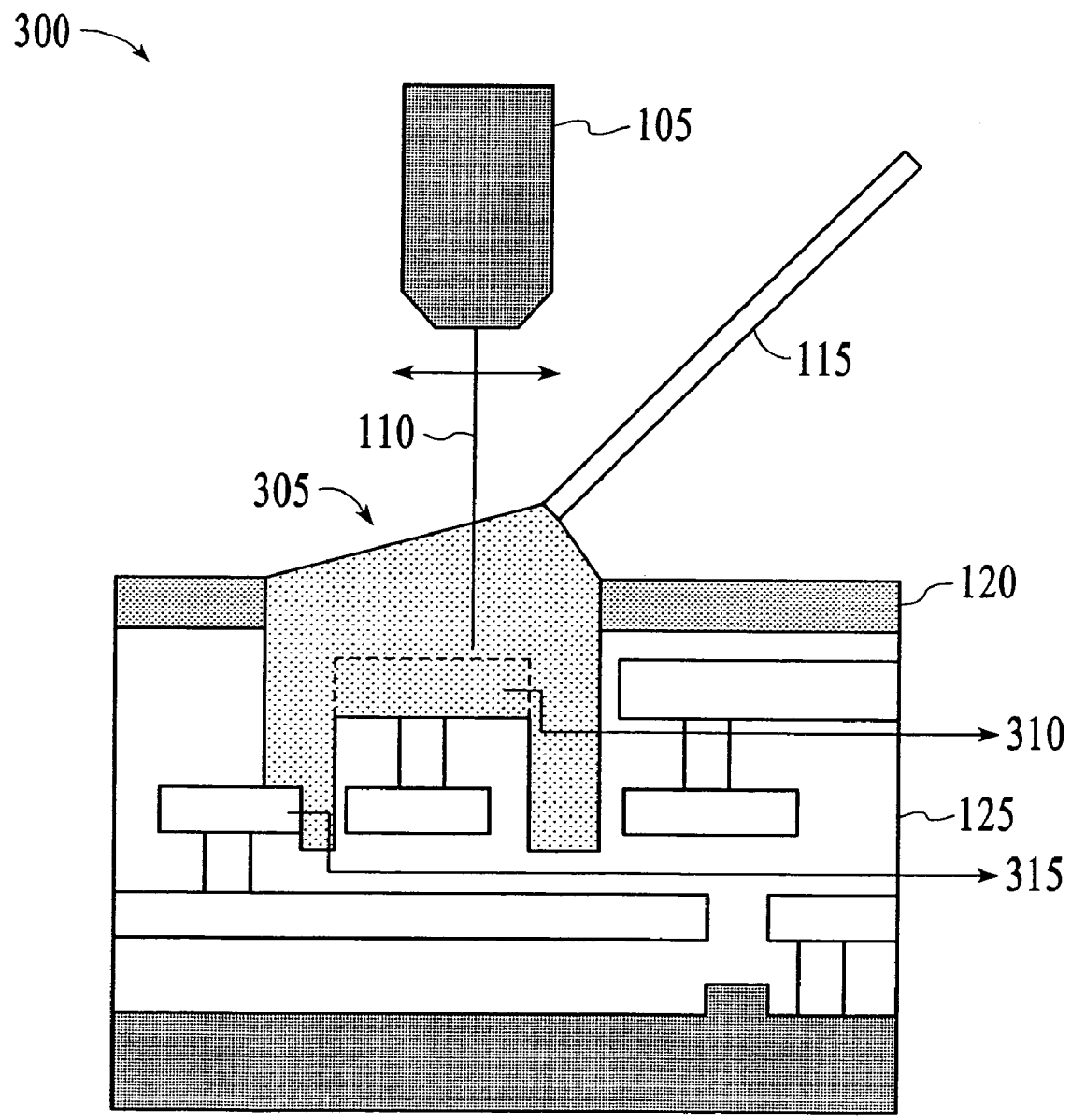
FIG. 3 is a schematic illustration of a typical consequence of use of $XeF_2$ to mill a copper trace after an overlying dielectric layer has been removed.
Figure 4:
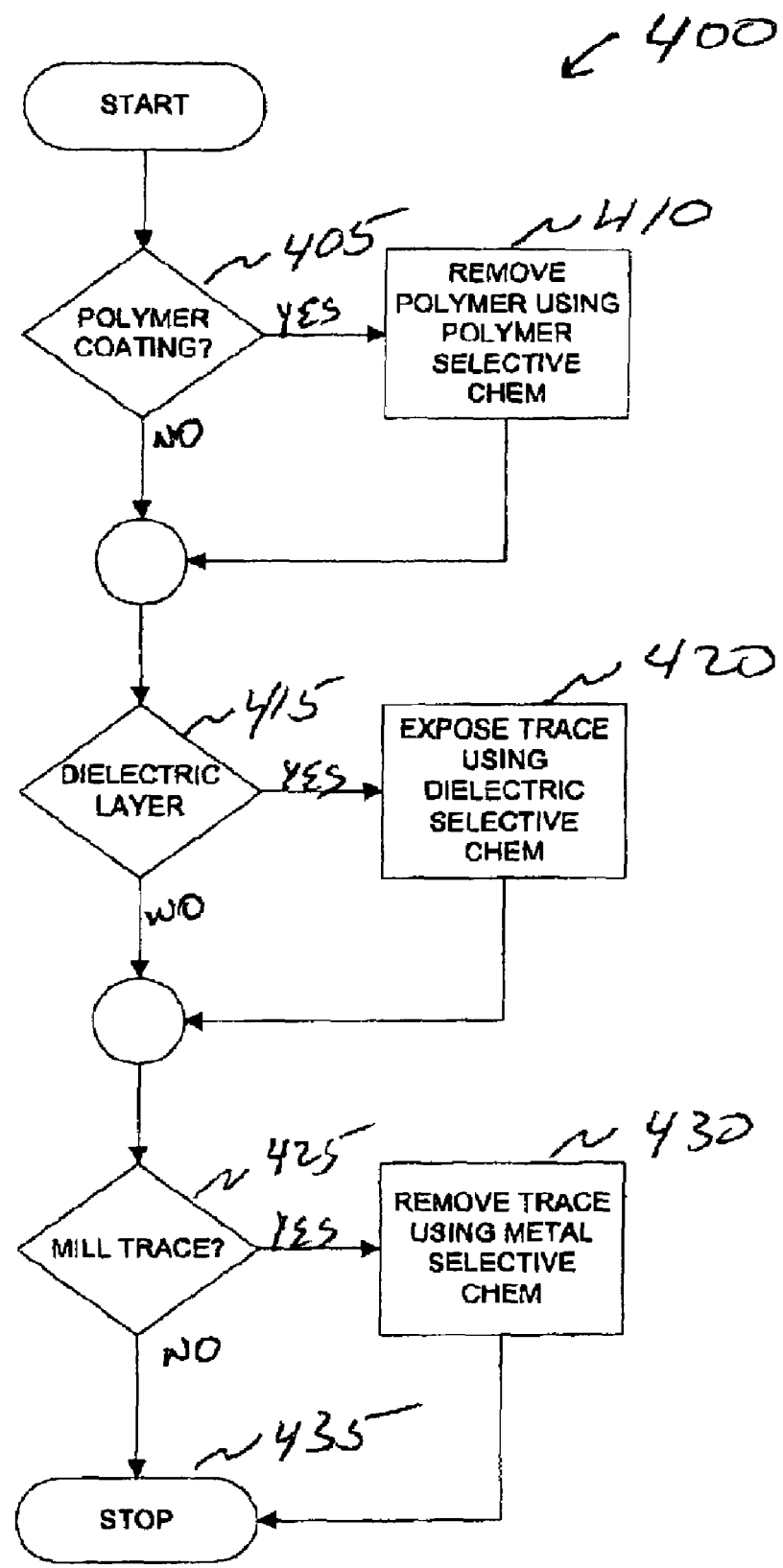
FIG. 4 is a flowchart of a preferred embodiment of the present invention.

FIG. 4 is a flowchart of a preferred embodiment of the present invention for a process 400 of processing a copper metal trace using a GAS system, with the metal trace disposed in a dielectric that may have an overlying protective layer (e.g., polyimide). Process 400 first tests at step 405 whether the protective polymer coating overlies the metal trace. When the protective polymer coating is present, process 400 removes the polymer using a polymer selective chemical in the GAS process (step 410). The polymer selective chemical is one that has a preferential etch of the particular polymer relative to the underlying dielectric that is greater than one, and more preferably greater than five to ten. In the preferred embodiment when the polymer is polyimide and the dielectric is $SiO_2$, the polymer selective chemical is selective carbon mill (SCM).

After step 410, and after step 405 when there is no overlying protective polymer layer, process 400 tests whether the dielectric overlying the metal trace is present (step 415). When step 415 tests yes, process 400 exposes the metal trace using a dielectric selective chemical in the GAS process (step 420). The dielectric selective chemical is one that has a preferential etch of the dielectric relative to the metal trace that is greater than one, and more preferably greater than five to ten. In the preferred embodiment when the dielectric is $SiO_2$ and the metal trace is copper, the dielectric selective chemical is $XeF_2$.

After step 420, and after step 415 when there is no overlying dielectric layer, process 400 tests whether the exposed metal trace is to be milled (step 425). When step 425 tests yes, process 400 mills the exposed metal trace using a metal selective chemical in the GAS process (step 430). The metal selective chemical is one that has a preferential etch of the particular polymer relative to the underlying dielectric that is greater than one, and more preferably greater than five to ten. In the preferred embodiment when the metal trace is copper and the dielectric is $SiO_2$, the metal selective chemical is selective carbon mill (SCM), which efficiently is also the polymer selective chemical. In the preferred embodiment, it is advantageous to use two chemicals as opposed to three in order to simply process 400. Additionally, the use of SCM as the metal selective chemical is surprising since SCM has a minor acceleration effect on the milling of copper. However, the metal selective chemical is chosen for the relative effect on the interface materials, here copper and $SiO_2$. The SCM is very slow for etching $SiO_2$, therefore the relative etching differential falls within the appropriate range.

After step 430, and after step 425 when an exposed metal trace is not to be milled, process 400 terminates at step 435.

Figure 5:
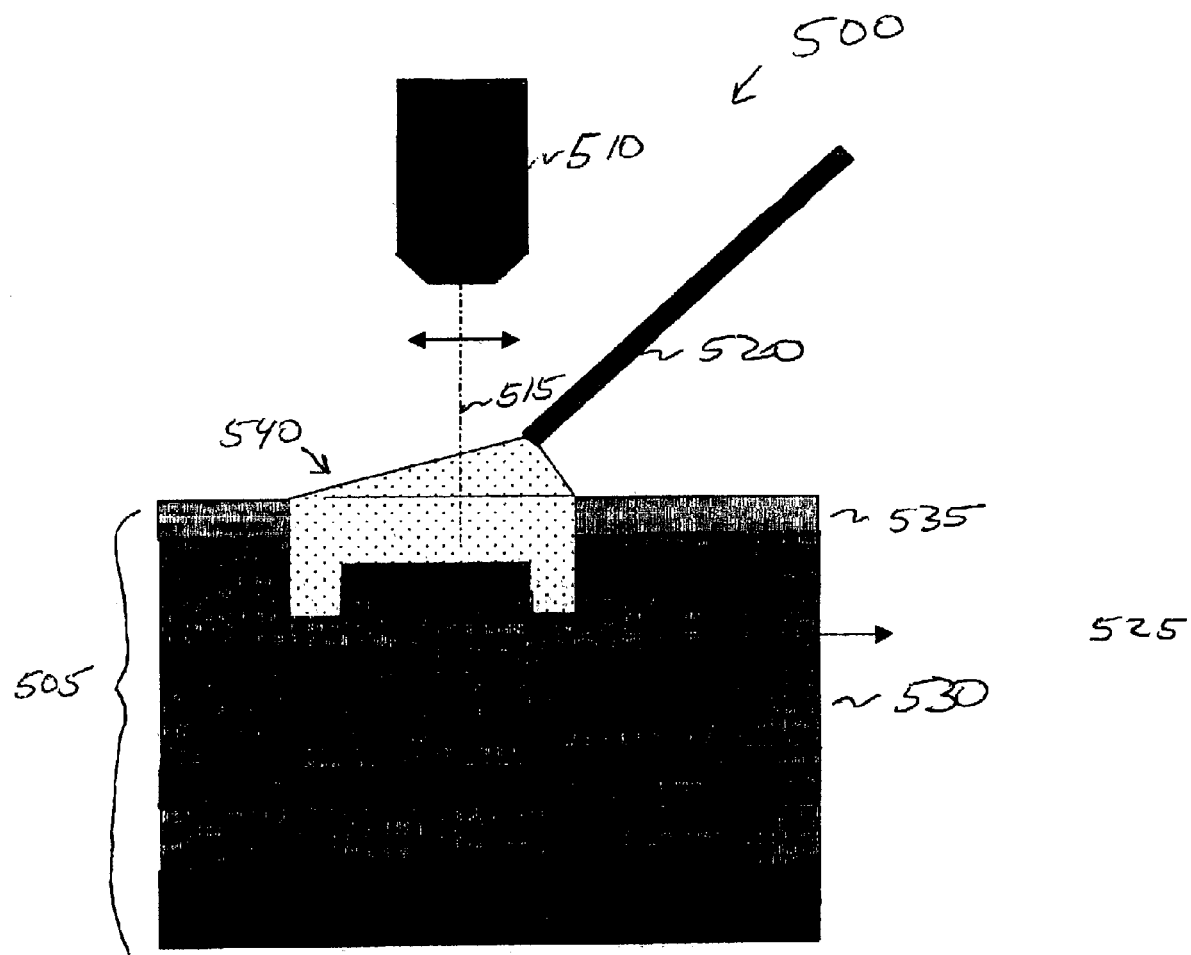
FIG. 5 is a schematic illustration of a cross section of an integrated circuit in which a copper trace disposed in a dielectric having an overlying protective polyimide layer has been exposed according to a preferred embodiment of the present invention.

FIG. 5 is a schematic illustration of a cross section of a GAS system 500 processing an integrated circuit 505. GAS system 500 includes a focused ion beam (FIB) column 510 for generating a focused ion beam 515 in the presence of a gas directed to the work surface by a gas injector 520. Integrated circuit 505 has a copper trace 525 disposed in a dielectric layer 530 having an overlying protective polyimide layer 535. Exposing trace 525 using process 500 creates a uniform trench 540.

Figure 6:
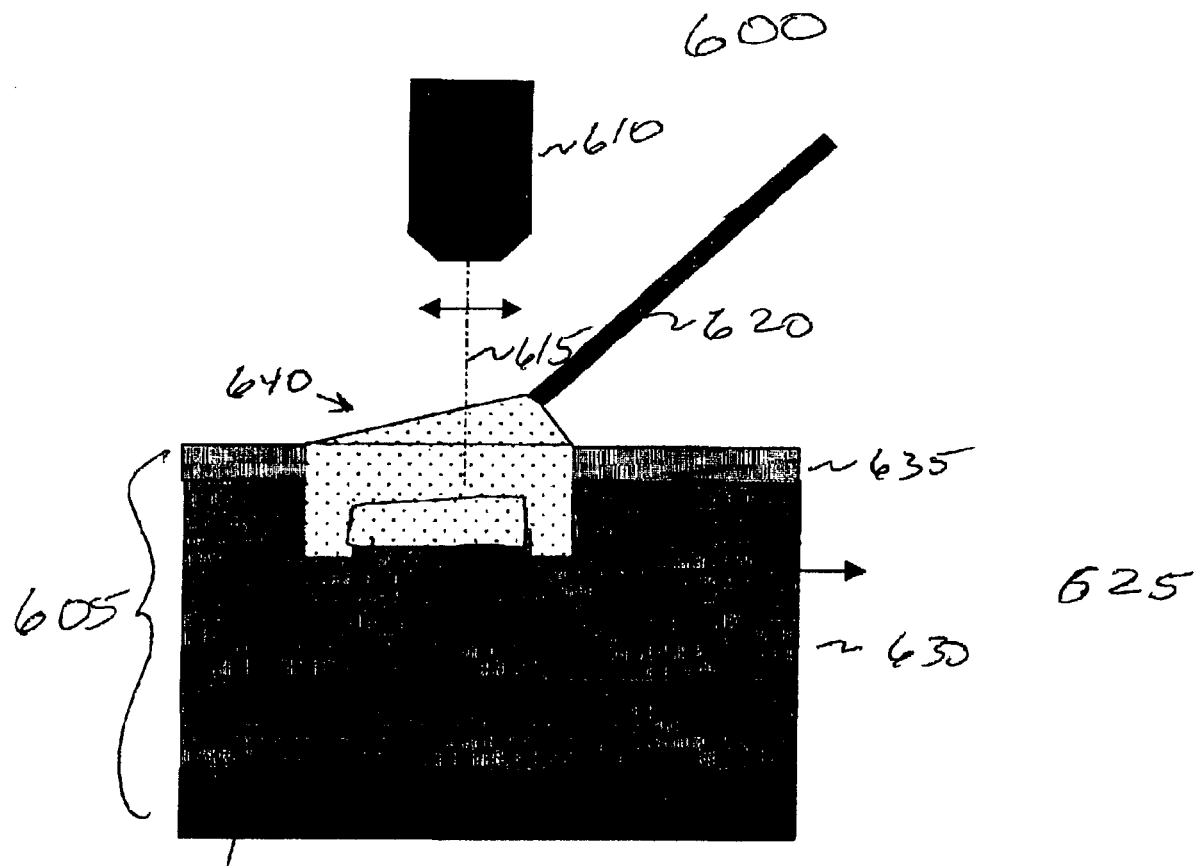
FIG. 6 is a schematic illustration of a cross section of an integrated circuit in which a copper trace disposed in a dielectric having an overlying protective polyimide layer has been milled according to a preferred embodiment of the present invention.

FIG. 6 is a schematic illustration of a cross section of a GAS system 600 processing an integrated circuit 605. GAS system 600 includes a focused ion beam (FIB) column 610 for generating a focused ion beam 615 in the presence of a gas directed to the work surface by a gas injector 620. Integrated circuit 605 had a copper trace 625 (now shown in phantom) disposed in a dielectric layer 630 having an overlying protective polyimide layer 635. Milling trace 625 using process 400 creates a uniform trench 640 absent the portion of the metal trace without the disadvantages of the prior art.

The present invention simply and efficiently enables exposure and/or milling of a metallization layer of copper disposed in a dielectric that may have an overlying polymer (e.g., polyimide) protective layer and could be used with GAS and/or FIB machines previously used with aluminum metallization layers. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

The invention claimed is:

1. A method of using a gas-assisted (GAS) system for exposing a portion of a copper metal trace disposed in a dielectric, comprising the steps of:
   a) removing a portion of polymer coating overlying the dielectric, wherein the step of removing the polymer coating comprises using a polymer selective chemical; and
   b) removing a portion of the dielectric overlying the portion of the copper metal trace using the GAS system activated with a dielectric selective chemical that does not have a significant spontaneous reaction with the metal trace, wherein the step of removing the polymer coating occurs prior to the step of removing a portion of the dielectric.

2. The method of claim 1 wherein the dielectric selective chemical is $XeF_2$.

3. The method of claim 1 wherein the polymer is a polyimide.

4. The method of claim 3 wherein the dielectric selective chemical is $XeF_2$ and the polymer selective chemical is Selective Carbon Mill (SCM).

5. The method of claim 1 further comprising the step of:
   c) removing the portion of the exposed metal trace using the GAS system activated with a copper selective chemical.

6. The method of claim 5 wherein the copper selective chemical is Selective Carbon Mill.

7. The method of claim 1 further comprising the step of:
   c) removing the portion of the exposed metal trace using the GAS system activated with a copper selective chemical.

8. The method of claim 7 wherein the copper selective chemical is Selective Carbon Mill.

9. A method of using an aluminum trace etching focused ion beam (FIB) machine for exposing a portion of a copper trace disposed in a dielectric, comprising the step of:
   a) removing a portion of the dielectric overlying the portion of the copper trace using the FIB machine activated with a dielectric selective chemical that does not have a significant non-FIB induced reaction with copper, wherein the portion of the dielectric has an overlying polymer layer; and
   b) removing, prior to the removing the dielectric layer, a portion of the polymer layer using the FIB machine activated with a polymer selective chemical.

10. The method of claim 9 wherein the dielectric selective chemical is $XeF_2$.

11. The method of claim 9 wherein the polymer is a polyimide.

12. The method of claim 11 wherein the dielectric selective chemical is $XeF_2$ and the polymer selective chemical is Selective Carbon Mill (SCM).

13. The method of claim 9 further comprising the step of:
   c) removing the portion of the exposed copper trace using the FIB machine activated with a copper selective chemical.

14. The method of claim 13 wherein the copper selective chemical is Selective Carbon Mill.

15. The method of claim 9 further comprising the step of:
   c) removing the portion of the exposed copper trace using the FIB machine activated with a copper selective chemical.

16. The method of claim 15 wherein the copper selective chemical is Selective Carbon Mill.

* * * * *